(12) United States Patent
Cok

(10) Patent No.: US 7,583,022 B2
(45) Date of Patent: Sep. 1, 2009

(54) OLED DISPLAY WITH ELECTRODE

(75) Inventor: Ronald S. Cok, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 510 days.

(21) Appl. No.: 10/909,659

(22) Filed: Aug. 2, 2004

(65) Prior Publication Data

US 2006/0022589 A1 Feb. 2, 2006

(51) Int. Cl.
H01L 51/00 (2006.01)

(52) U.S. Cl. .................. 313/506; 313/504; 313/46

(58) Field of Classification Search .......... 313/504, 313/506, 512, 46; 428/690, 917
See application file for complete search history.

(56) References Cited

U.S. PATENT DOCUMENTS

| 5,821,692 | A | 10/1998 | Rogers |
| 6,265,820 | B1 | 7/2001 | Ghosh et al. |
| 6,384,427 | B1* | 5/2002 | Yamazaki et al. ............ 257/59 |
| 6,480,389 | B1 | 11/2002 | Shie et al. |
| 6,531,815 | B1* | 3/2003 | Okuyama et al. ........... 313/506 |
| 6,608,283 | B2 | 8/2003 | Liu et al. |
| 6,633,123 | B2 | 10/2003 | Tazawa |
| 6,641,933 | B1 | 11/2003 | Yamazaki et al. |
| 6,689,492 | B1* | 2/2004 | Yamazaki et al. ............ 428/690 |
| 7,147,530 | B2* | 12/2006 | Yamazaki et al. ............ 445/24 |
| 2002/0043929 | A1 | 4/2002 | Tazawa |
| 2003/0143423 | A1 | 7/2003 | McCormick et al. |
| 2003/0203700 | A1 | 10/2003 | Clark |
| 2004/0004436 | A1 | 1/2004 | Yoneda |
| 2004/0061438 | A1 | 4/2004 | Yamazaki et al. |

FOREIGN PATENT DOCUMENTS

| EP | 1 351 323 | 10/2003 |
| JP | 11195484 | 7/1999 |
| JP | 2003100447 | 4/2003 |
| JP | 2003-208980 | * 7/2003 |

* cited by examiner

Primary Examiner—Karabi Guharay
(74) Attorney, Agent, or Firm—Raymond L. Owens

(57) ABSTRACT

An OLED display comprising a substrate; at least one heat insulating layer disposed over the substrate; a first electrode located over the heat insulating layer and having a thermal conductivity higher than the heat insulating layer; a plurality of thermal contacts provided through the heat insulating layer between the first electrode and the substrate, the thermal contacts comprising material having a thermal conductivity higher than that of the heat insulating layer; one or more organic layers, at least one of which is a light emissive layer, disposed over the first electrode; and a second electrode disposed over the one or more organic layers.

19 Claims, 2 Drawing Sheets

OLED DISPLAY WITH ELECTRODE

FIELD OF THE INVENTION

The present invention relates to organic light-emitting diode devices. In particular, the present invention relates to improving device lifetime and reducing localized non-uniformity in an OLED device due to heating within an organic light-emitting display device.

BACKGROUND OF THE INVENTION

Solid-state organic light emitting diode (OLED) image displays are of great interest as a superior flat-panel display technology. These displays utilize current passing through thin films of organic material to generate light. The color of light emitted and the efficiency of the energy conversion from current to light are determined by the composition of the organic thin-film material. Different organic materials emit different colors of light. However, as the display is used, the organic materials in the device age and become less efficient at emitting light. This aging effect is dependent on the temperature of the OLED display and is increased at higher temperatures. It is useful, therefore, to provide a means to reduce the temperature of an OLED device in operation.

OLED devices are conventionally either top-emitting or bottom-emitting. An OLED display is constructed upon a substrate by depositing a first electrode upon the substrate, organic light emitting materials over the first electrode, and a second electrode above the light emitting materials. A cover is used to encapsulate and protect the device. Light is emitted by the application of a current from one electrode to another passing through the organic light emitting materials. A bottom-emitting device emits light through the substrate and first electrode, which must both be transparent. The second electrode may be either transparent or reflective. A top-emitting device emits light through the cover and second electrode, which must both be transparent. In this case, the first electrode may be either transparent or reflective.

A variety of materials may be used to construct suitable substrates and encapsulating covers for OLED devices and to fill the cavity between the second electrode and the cover. The desirable material properties and/or characteristics of an OLED substrate and cover include low cost, very flat surface, low coefficient of thermal expansion (CTE), high strength and stability under a variety of environmental stresses, and electrically non-conductive (or able to be coated with electrically non-conductive material). The material used most often for such substrates is glass, typically borosilicate glass, because it is transparent, very stable, can be made at low cost, and has a very smooth surface suitable for the deposition and processing of semiconductor and organic materials. Other substrate materials, both rigid and flexible, have been described in the art, for example ceramics, plastics, and metals such as stainless steel (see U.S. Pat. No. 6,641,933 B1 to Yamazaki et al. entitled "Light-Emitting EL Display Device").

Organic light-emitting diodes can generate efficient, high-brightness displays. In operation, OLED devices are provided with a voltage differential across the electrodes by an external power supply either directly (as in a passive-matrix OLED device) or through a locally controlled power circuit (as is found in an active-matrix device). The voltage differential causes a current to flow through the OLED materials, which then causes the OLED materials to emit light. However, the conversion of current to light is relatively inefficient, so that much of the energy is converted to heat. Moreover, much of the emitted light does not escape from the OLED device and is reabsorbed into the device as heat. Hence, OLED devices can become very hot and operate at temperatures well in excess of ambient temperatures. For example, in an ambient environment of 20° C., applicants have demonstrated that an OLED may operate at 40° C. to 60° C. This heat is detrimental to the OLED device. As is well known, OLED materials degrade as they are used and degrade faster at higher temperatures. Therefore, providing improved heat management to cool an OLED device improves the lifetime of the OLED device.

While it is important to maintain the overall brightness of an OLED display, it is even more important to avoid localized degradation within a display. The human visual system is acutely sensitive to differences in brightness in a display. Hence, differences in uniformity are readily noticed by a user. Such localized differences in uniformity in an OLED display may occur as a consequence of displaying static patterns on the display, for example, graphic user interfaces often display bright icons in a static location. Such local patterns will not only cause local aging in an OLED display, but will also create local hot spots in the display, further degrading the light-emitting elements in the local pattern. Glass and plastic supports, the use of which is advantageous in view of their relative electrical non-conductivity, may not be sufficiently thermally conductive to provide a uniform temperature across the substrate when the display is in operation. Hence, improved thermal management techniques may significantly improve the life expectancy of an organic display device.

One method of removing heat from an organic light emitting display device is described in U.S. Pat. No. 6,265,820 to Ghosh et al., entitled, "Heat Removal System for Use in Organic Light Emitting Diode Displays Having High Brightness." The '820 patent describes a heat removal system for use in organic light emitting diode displays. The heat removal assembly includes a heat dissipating assembly for dissipating heat from the organic light emitting device, a heat transfer assembly for transferring heat from the top organic light emitting device to the heat dissipating assembly and a cooling assembly for cooling the organic light emitting display device. While the system of the '820 patent provides a means for heat removal in an OLED application, its efficiency is limited by the presence of a glass substrate having poor thermal conductivity characteristics through which heat generated by the OLED devices must transfer for removal. Moreover, the structure described in the '820 patent is complex, requiring multiple layers and specific heat transfer materials in contact with delicate OLED layers.

U.S. Pat. No. 6,480,389 to Shie et al. entitled "Heat Dissipation Structure for Solid-State Light Emitting Device Package" describes a heat dissipation structure for cooling inorganic LEDs characterized by having a heat dissipating fluidic coolant filled in a hermetically sealed housing where at least one LED chip is mounted on a metallic substrate within a metallic wall erected from the metallic substrate. U.S. Pat. No. 5,821,692 to Rogers et al. entitled "Organic Electroluminescent Device Hermetic Encapsulation Package" describes an organic electroluminescent device with a dielectric liquid filling the space between the cover and the organic electroluminescent device. Such arrangements are complex, require fluids, and are difficult to construct in devices such as OLEDs.

U.S. Patent Application Publication 2004/0004436 A1 to Yoneda entitled "Electroluminescent Display Device", describes an organic electroluminescent (EL) panel having a device glass substrate provided with an organic EL element on a surface thereof, a sealing glass substrate attached to the device glass substrate, a desiccant layer formed on a surface of the sealing glass substrate, and spacers disposed between a cathode of the organic EL element and a desiccant layer. A heat-conductive layer can be formed by vapor-depositing or sputtering a metal layer such as a Cr layer or an Al layer that inhibits damaging the organic EL element and increases a heat dissipating ability, thereby inhibiting aging caused by heat. U.S. Pat. No. 6,633,123 to Tazawa entitled "Organic Electroluminescence Device with an Improved Heat Radiation Structure." describes an organic electroluminescence device having a heat radiation layer higher in heat conductivity than the substrate. However, such structures, while useful, do not assist in removing heat from the electroluminescent element itself.

Heat sinks are also well known in the integrated circuit industry and are applied to cooling large integrated circuits. Such sinks typically are thick and are unsuitable for displays in which limiting the thickness of the display is an important goal.

It is therefore an object of the present invention to provide a more uniform distribution of heat within an OLED display and to improve the removal of heat from an OLED display device thereby increasing the lifetime of the display, while maintaining the simplicity of the design and manufacturing process as well as the thinness of the display.

SUMMARY OF THE INVENTION

In accordance with the invention there is provided an OLED display comprising a substrate; at least one heat insulating layer disposed over the substrate; a first electrode located over the heat insulating layer and having a thermal conductivity higher than the heat insulating layer; a plurality of thermal contacts provided through the heat insulating layer between the first electrode and the substrate, the thermal contacts comprising material having a thermal conductivity higher than that of the heat insulating layer; one or more organic layers, at least one of which is a light emissive layer, disposed over the first electrode; and a second electrode disposed over the one or more organic layers.

ADVANTAGES

The advantages of this invention are an OLED display device that provides a means to reduce the operating temperature of the light emissive layers in an OLED display device to decrease the rate of aging while maintaining the simplicity of design and manufacture as well as thinness of the display.

DETAILED DESCRIPTION OF THE INVENTION

Figure 2:
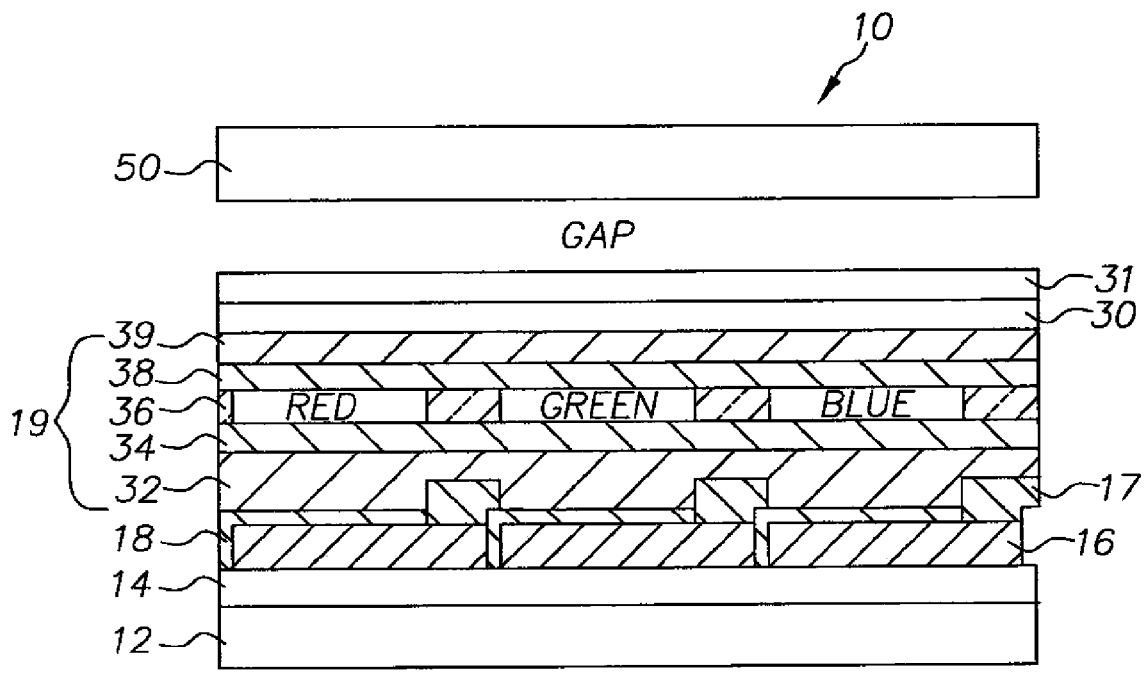
FIG. 2 is a cross sectional schematic diagram of a portion of a prior art top-emitting OLED display.

Referring to FIG. 2, a prior art top-emitting OLED display 10 is shown with a substrate 12, and a thin-film transistor (TFT) active-matrix layer 14 comprising an array of TFTs that provides power to OLED elements. A patterned first heat insulating layer 16 is provided over the TFT active-matrix layer 14, and an array of first electrodes 18 are provided over the first heat insulating layer 16 and in electrical contact with the TFT active matrix layer 14. A patterned second heat insulating layer 17 is provided over the array of first electrodes 18 such that at least a portion of the each of the first electrodes 18 is exposed. The first and second heat insulating layers 16 and 17 may be electrically and thermally insulating.

Over the first electrodes 18 and first heat insulating layer 16 are provided red, green, and blue-emitting organic electroluminescent (EL) elements 19. Herein, the collection of organic EL elements 19 may also be referred to as the organic EL layer. This organic EL layer 19 may be made up of other layers as is known in the art, for example a hole-injection layer 32, hole-transport layer 34, light emissive layer 36, electron-transport layer 38, and electron injection layer 39. Alternatively, a single continuous white emitting layer may be used with an array of color filters in the place of separate red, green and blue light emitting elements.

The light-emitting pixel area is generally defined by the area of the first electrode 18 in contact with the organic EL elements 19. Over the organic EL layer 19 is provided a common second electrode 30. The first electrode 18, second electrode 30 and the first heat insulating layer 16 may be formed by employing a thin-film manufacturing technique. Each first electrode 18 in combination with its associated organic EL element 19 and second electrode 30 is herein referred to as an OLED element. A typical OLED display comprises an array of OLED elements wherein each OLED element emits red, green or blue. However, monochrome display devices are also known wherein the array of OLED elements emit the same color light, for example, white. An encapsulating or protective layer 31 may be provided over the second electrode 30.

In operation, the thin-film transistors in TFT active-matrix layer 14 allow current to flow between the first electrodes 18, each of which can be selectively addressed, and the common second electrode 30. Holes and electrons recombine within the organic EL elements 19 to emit light.

In a conventional, prior-art OLED device (as shown in FIG. 2), the heat generated within the EL elements 19 must pass through the first and second electrodes 18 and 30 before it can escape from the OLED display 10. Some of the heat can pass through the first electrode 18, through the first heat insulating layer 16, and thence through the substrate 12, while some of the heat passes through the second electrode 30 and an encapsulating cover 50. However, as demonstrated by applicant, the heat generated by operation of the OLED device cannot readily be conducted out of the OLED device because of the heat insulating layers within the device.

Figure 1:
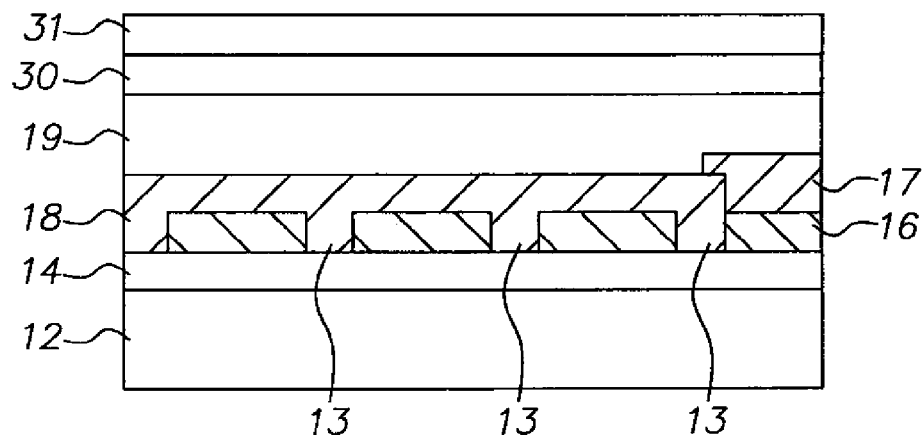
FIG. 1 is a cross sectional schematic diagram of an OLED display according to the present invention.

Referring to FIG. 1, according to one embodiment of the present invention, the first electrode 18 has a plurality of thermal contacts 13 having a thermal conductivity higher than the thermal conductivity of the first heat insulating layer 16. First heat insulating layer 16 is conventionally formed of silicon materials, for example silicon dioxide or silicon nitride having a thermal conductivity of approximately 1 W/mK. The first heat insulating layer 16 may also be an epoxy or photoresist. The thermal contacts 13 extend through the first heat insulating layer 16 and comprise a material that is more thermally conductive than the first heat insulating layer 16. Suitable thermally conductive materials for use in the thermal contacts 13 may include the same materials used to form the first electrode 18, for example metals such as silver, aluminum, or manganese, metal oxides such as indium tin oxide (ITO), or metal alloys having a thermal conductivity higher than that of the first heat insulating layer 16, for example 237 W/mK for Al or 427 W/mK for Ag. Other metals useful in forming electrodes may be employed as long as they have a thermal conductivity higher than the thermal conductivity of the first heat insulating layer 16. Since the size of the light-emitting area of the electroluminescent element 19 is relatively large compared to the current integrated circuit found in the art, for example 50 microns by 200 microns, the thermal contacts 13 can be constructed easily using conventional lithographic processes.

Figure 3:
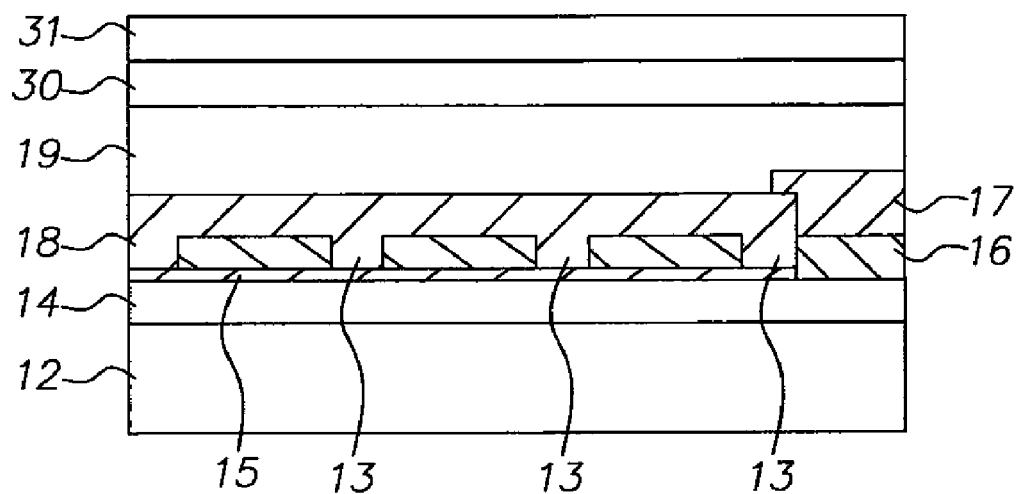
FIG. 3 is a cross sectional schematic diagram of an alternative embodiment of an OLED display according to the present invention.

The thermal contacts 13 may contact the substrate 12. In one embodiment, the substrate 12 is thermally conductive, for example if it is made from metal or metal foil. The substrate 12 may be a flexible substrate. Alternatively, the thermal contacts 13 may contact an additional thermally conductive layer 15. Referring to FIG. 3, a thermally conductive layer 15 is located above the substrate 12 and below the first heat insulating layer 16. It is also possible for the thermally conductive layer 15 to be electrically conductive and form alternative connections to the first electrode 18, thereby serving to distribute current to the first electrode 18 as well as distribute heat from the first electrode 18 through the thermal contacts 13.

Figure 4:
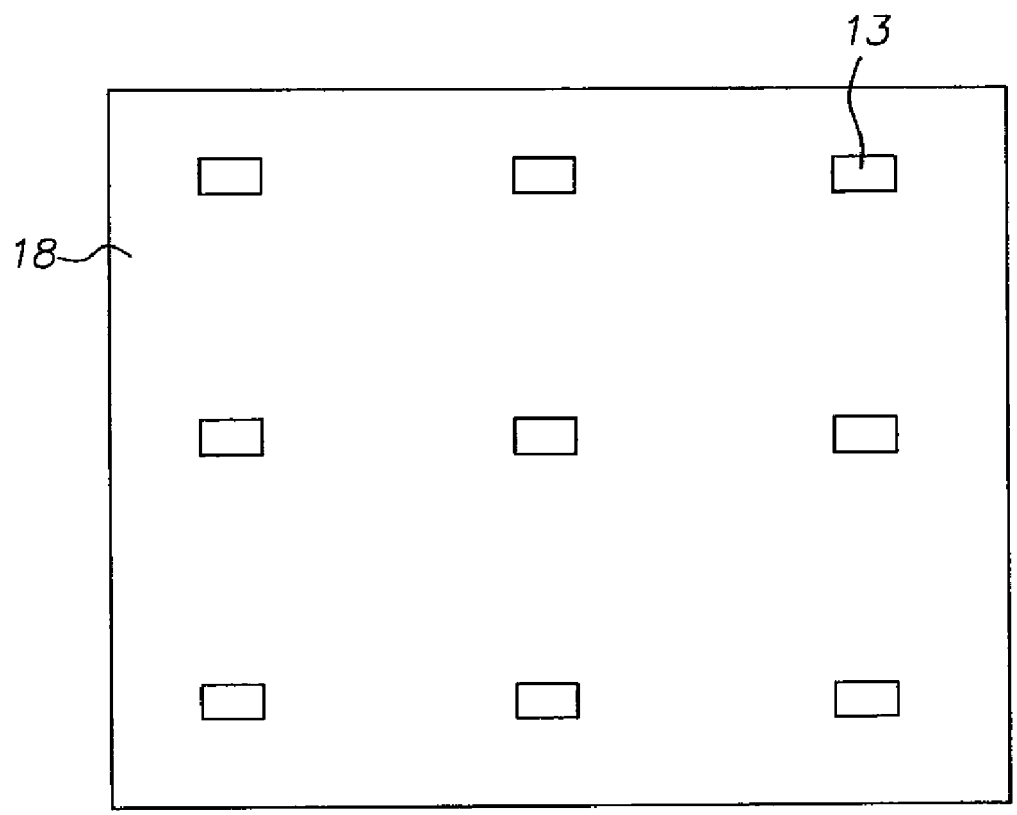
FIG. 4 is a top view schematic diagram of an embodiment of an OLED display according to the present invention.

The number and size of the thermal contacts 13 may be chosen to accommodate the lithographic manufacturing processes employed in manufacturing the device. In applications where thermal considerations are acute, a large number of thermal contacts 13 may be employed. Referring to FIG. 4, a plurality of thermal contacts 13 are shown in a top view distributed in a two-dimensional array over the first electrode 18 of the OLED device. The thermal contacts 13 may be located in the center of the first electrode 18, around the edges of the first electrode 18, or in any location required by the application. The thermal contacts 13 may have a variety of cross-sections depending on the needs of the applications, for example circular or rectangular cross-sections. By increasing or decreasing the size or periodicity of the thermal contacts 13, a greater or smaller thermally conductive area may be provided.

According to one embodiment of the present invention, heat generated within the OLED device is conducted into the first electrode 18, through the thermal contacts 13 away from the organic EL layer 19, thereby cooling the OLED device and prolonging its lifetime. The heat may be distributed further by a thermally conductive substrate or by a thermally conductive layer 15 under the first heat insulating layer 16.

Thermal contacts 13 may conveniently be formed by forming a plurality of vias in first heat insulating layer 16, and subsequently filling the vias with thermally conductive material. The vias for the thermal contacts 13 can be patterned at the same time as the first heat insulating layer 16 is formed so that no further photolithography steps are necessary to create the thermal contacts 13. The thermal contacts 13 can comprise the same material as the first electrode 18 and the thermal contact 13 and first electrode 18 can be formed in a common manufacturing step. Alternatively, if a non-electrically but thermally conductive contact is desired, a thermally conductive polymer or cured epoxy may be employed.

According to the present invention, the thermal contacts 13 may be employed in either a top emitter or bottom emitter configuration. In a top emitter configuration, the thermal contacts 13 comprise a thermally conductive material that may be opaque, transparent, or reflective. In a bottom emitter configuration, the thermally conductive material may be transparent. In an additional bottom emitter embodiment, the first electrode 18 is transparent but the thermal contacts 13 may be opaque. An opaque thermal contact may be necessary to effectively transfer heat. While an opaque thermal contact will not transmit light as effectively as a transparent thermal contact, the benefit gained from improved heat distribution may more than compensate for any loss of light emitted from the device. The thermal contacts 13 may contact the substrate 12, other planarization or insulative layers formed on the substrate or the TFT active-matrix layer 14. Any of these layers may also serve as thermal conductors to spread heat horizontally or vertically within the device. The number, shape and structure of the thermal contacts 13 may be the same or different depending on the processes used to manufacture the OLED device or to meet the needs of a specific application.

In a preferred embodiment, the invention is employed in a device that includes Organic Light Emitting Diodes (OLEDs) that are composed of small molecule or polymeric OLEDs as disclosed in but not limited to U.S. Pat. No. 4,769,292, to Tang et al., and U.S. Pat. No. 5,061,569 to VanSlyke et al. Many combinations and variations of organic light emitting displays can be used to fabricate such a device.

The invention has been described in detail with particular reference to certain preferred embodiments thereof, but it will be understood that variations and modifications can be effected within the spirit and scope of the invention.

PARTS LIST

10 OLED display
12 substrate
13 thermal contact
14 TFT active-matrix layer
15 thermally conductive layer
16 first heat insulating layer
17 second heat insulating layer
18 first electrode
19 electroluminescent (EL) element or EL layer
30 second electrode
31 encapsulating layer
32 hole-injection layer
34 hole-transport layer
36 light emissive layer
38 electron-transport layer
39 electron injection layer
50 cover

The invention claimed is:

1. An OLED device, comprising:
a) a substrate;
b) at least one heat insulating layer disposed over the substrate;
c) a first electrode located over the heat insulating layer and having a thermal conductivity higher than the heat insulating layer;
d) a plurality of spatially separated thermal contacts for the first electrode, each formed in a separate corresponding via provided through the heat insulating layer between the first electrode and the substrate, the thermal contacts comprising material having a thermal conductivity higher than that of the heat insulating layer and extending from the first electrode through the via to the substrate or a layer formed on the substrate but which does not conduct current;
e) one or more organic layers, at least one of which is a light emissive layer, disposed over the first electrode; and
f) a second electrode disposed over the one or more organic layers.

2. The device claimed in claim 1 wherein the thermal contacts are in thermal contact with the first electrode.

3. The device claimed in claim 2 wherein the thermal contacts are touching the first electrode.

4. The device claimed in claim 3 wherein the thermal contacts are formed in a common manufacturing step with the first electrode.

5. The device claimed in claim 2, wherein the thermal contacts and the first electrode comprise the same material.

6. The device claimed in claim 2, wherein the first electrode is made of a metal, a metal oxide, or a metal alloy including one or more of the group including silver, aluminum, manganese, indium tin oxide, or alloys thereof.

7. The device claimed in claim 1, wherein the heat insulating layer comprises silicon.

8. The device claimed in claim 7, wherein the heat insulating layer is silicon dioxide.

9. The device claimed in claim 7, wherein the heat insulating layer is silicon nitride.

10. The device claimed in claim 1, wherein the heat insulating layer has a thermal conductivity of approximately 1 W/mK.

11. The device claimed in claim 1, wherein the heat insulating layer is an epoxy or a photoresist.

12. The device claimed in claim 1, wherein the second electrode transmits light emitted by the light emissive layer.

13. The device claimed in claim 1, further comprising a thermally conductive layer located between the substrate and the heat insulating layer, and between the substrate and the first electrode.

14. The device claimed in claim 13, wherein the thermally conductive layer is electrically conductive.

15. The device claimed in claim 13, wherein the thermally conductive layer is electrically connected to the first electrode.

16. The device claimed in claim 1, wherein the thermal contacts form a two-dimensional arrangement within a singe pixel area.

17. The device claimed in claim 1, wherein the substrate is made of a glass, metal foil, plastic or one or more layers of glass, metal foil, or plastic.

18. The device claimed in claim 1, wherein the substrate is flexible.

19. The device claimed in claim 1 wherein the first electrode is transparent and the thermal contacts are not transparent.

* * * * *

UNITED STATES PATENT AND TRADEMARK OFFICE
CERTIFICATE OF CORRECTION

PATENT NO.        : 7,583,022 B2                                                      Page 1 of 1
APPLICATION NO.   : 10/909659
DATED             : September 1, 2009
INVENTOR(S)       : Ronald S. Cok It is certified that error appears in the above-identified patent and that said Letters Patent is hereby corrected as shown below:

Column 8, line 11        In Claim 16, delete "singe" and insert -- single --, therefor.

Signed and Sealed this

Nineteenth Day of January, 2010

David J. Kappos
*Director of the United States Patent and Trademark Office*